GAIN CONTROL SYSTEM FOR COMMON-COLLECTOR TRANSISTOR STAGE
Filed July 11, 1961
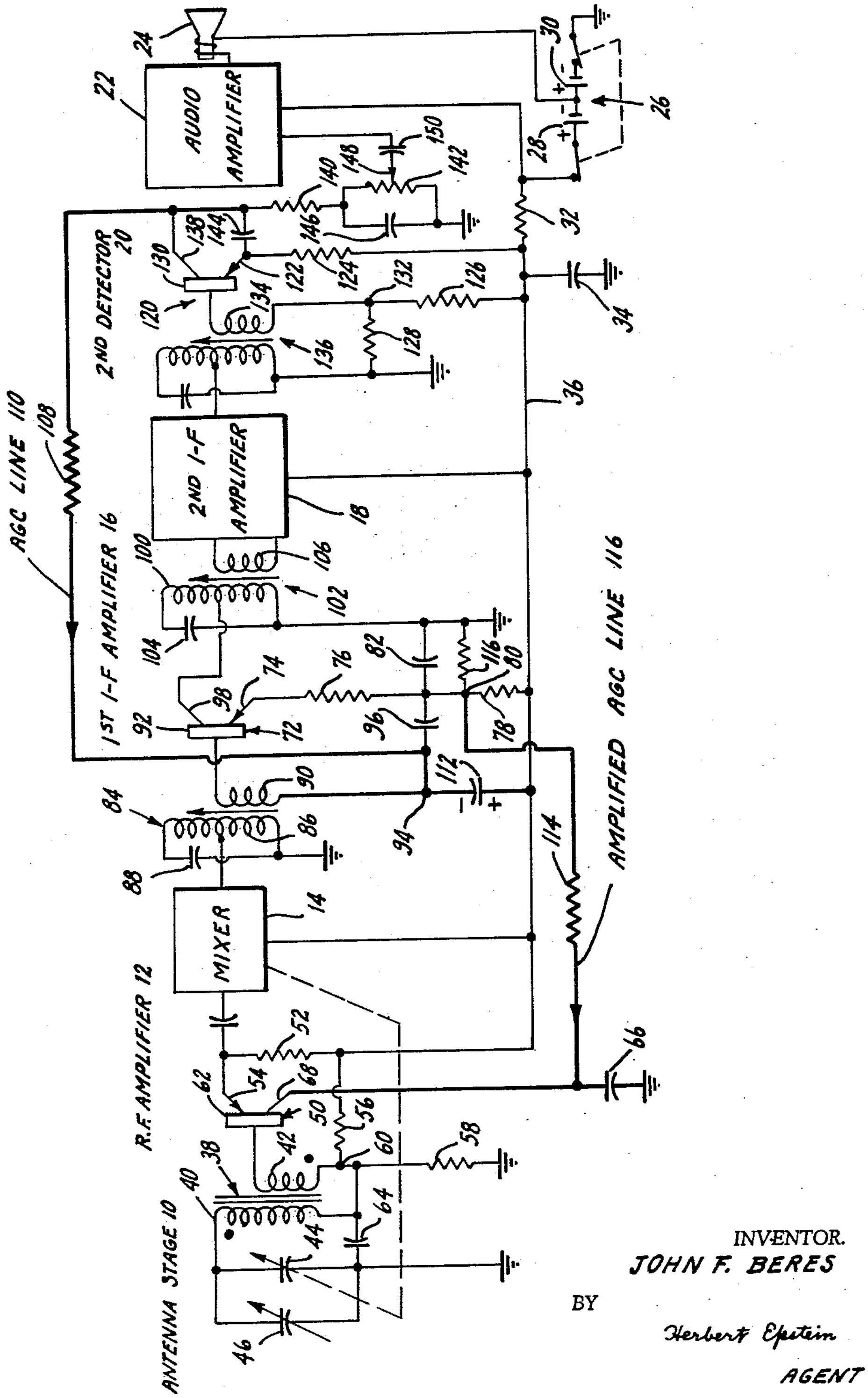
INVENTOR.
JOHN F. BERES
BY
Herbert Epstein
AGENT United States Patent Office 3,148,338 Patented Sept. 8, 1964

3,148,338

GAIN CONTROL SYSTEM FOR COMMON-COLLECTOR TRANSISTOR STAGE

John F. Beres, Southampton, Pa., assignor, by mesne assignments, to Philco Corporation, Philadelphia, Pa., a corporation of Delaware Filed July 11, 1961, Ser. No. 123,204
5 Claims. (Cl. 330—29)

This invention relates to a system for controlling the gain of a semiconductor signal-translating stage over an unusually wide range.

Heretofore designers of transistor radio receivers have had difficulty in obtaining a sufficiently wide range of automatic gain control to prevent such receivers from blocking and distorting when supplied with moderately strong radio signals. In this regard, the gain of transistor amplifiers heretofore has been decreased by either decreasing the static reverse-biasing collector voltage of the transistor below a given small value ($V_c$ control) or decreasing the static emitter current of the transistor below a given low intensity ($I_e$ control). However the variations in gain so obtained are not sufficiently wide to prevent the overloading of transistor receivers by signals which, though strong, could readily be received without overloading by a conventional vacuum-tube radio receiver.

To increase the ability of transistor receivers to operate in response to strong radio signals without overloading, some transistor receivers comprise, in addition to the conventional AGC system, a diode connected across the R.-F. input terminals thereof. In such receivers means are provided to reverse-bias this diode into its high impedance condition in response to radio signals having amplitudes less than a given value and to forward-bias the diode increasingly into its low-impedance condition in response to radio signals having amplitudes increasingly greater than said given value. Under these conditions, when weak signals are received, the diode has substantially no effect on the operation of the receiver. When strong signals are received, the diode bypasses a substantial portion of the signal to ground, permitting only a fraction thereof to reach the first stage of the receiver. The use of a diode in this manner is undesirable because a diode is a relatively expensive component and because the diode performs no useful function so long as the incoming radio signal is relatively weak.

Accordingly it is an object of the invention to provide a semiconductor signal-translating system capable of an unusually wide range of automatic gain control.

Another object is to provide a system which amplifies the signal when the amplitude of the input signal is below a given value and attenuates the input signal when its amplitude exceeds said given value.

Another object is to provide a system of the foregoing kind which requires no additional components to attenuate the input signal.

Another object is to provide a system of the foregoing kind which is simple in structure and reliable in operation.

The foregoing objects are achieved by a signal-translating system comprising a transistor having a base, an emitter and a collector, means for applying an input signal between the base and collector of this transistor, and means responsive to the input signal to apply, also between said base and collector, a voltage having a reverse-biasing polarity when the amplitude of the input signal is less than a given value, and a forward-biasing polarity when the latter amplitude is equal to or greater than said given value. Typically a load element is connected to the emitter of the transistor to derive an output signal therefrom.

In such a system, the transistor amplifies the input signal in conventional manner so long as the amplitude of the input signal is less than said given value and the base-collector path is reverse biased. However when the amplitude of the input signal exceeds said given value, the signal-responsive-means forward biases the base-collector path of the transistor. Under these conditions, the transistor no longer functions in its normal manner. Instead the base-collector diode and base-emitter diode, each forward-biased and having a low impedance, act relatively independently of one another. The base-collector diode by-passes a substantial fraction of the input signal current. As a result only a fraction of the input signal current flows through the base-emitter diode and the emitter load impedance element to develop an output signal. Thus under these conditions the transistor attenuates considerably the input signal. This attenuation increases considerably the total range of gain variation obtainable from a transistor as compared to the ranges heretofore obtained by employing prior-art gain control methods. Moreover, this attenuation is achieved by varying the operating conditions of a transistor which otherwise serves an amplifying function in the receiver, without the need for expensive additional parts which serve no useful function when weak signals are being received.

Other advantages and features of the invention will become apparent from a consideration of the following detailed description, taken in connection with the accompanying drawings, the single figure of which is a schematic diagram of a radio receiver embodying a signal-translating system according to the invention.

The signal receiving apparatus shown in the drawing is a superheterodyne receiver of generally conventional form, comprising an antenna stage 10, an R.-F. amplifier 12, a mixer 14, a first I.-F. amplifier 16, a second I.-F. amplifier 18, a second detector 20, an audio amplifier 22 and a loudspeaker 24. The foregoing stages are serially coupled to one another in the order stated, and are supplied with operating voltages by a source 26 comprising batteries 28 and 30. Audio amplifier 22 is supplied directly from source 26 while the other stages are supplied by way of a filter network comprising a resistor 32 and a high-valued capacitor 34, and a supply bus 36 connected to the output of this filter.

Mixer 14, second I.-F. amplifier 18 and audio amplifier 22 may have conventional structure, and hence are indicated in block form in the circuit diagram. A suitable circuit for each of these stages is shown, for example, in the publication, "Philco Transistor Radio Service Manual," No. PR–3616, Figure 4, published by the Philco Corporation, Philadelphia 34, Pennsylvania. The circuits of the R.-F. and first I.-F. amplifiers 12 and 16 and of second detector 20 are set forth in detail in the drawings to show clearly the structure of the automatic gain control system of the invention.

Antenna stage 10 comprises an antenna transformer 38 the primary winding 40 of which functions as a loop antenna and the secondary winding 42 of which supplies the radio signal picked up by winding 40 to R.-F. amplifier 12. Primary coil 40 is tuned to incoming radio waves of the desired frequency by a variable capacitor 44 and a trimmer capacitor 46. The variable plates of capacitor 44 are mechanically coupled in conventional manner to the tuning element of the variable-frequency oscillator (not shown) of mixer stage 14 so that the oscillator frequency tracks in conventional manner the frequency to which stage 10 is tuned.

R.-F. amplifier 12, the controlled stage in the AGC system of the invention, comprises a transistor 50 connected in the common-collector configuration. When relatively weak radio signals are received, this stage amplifies their power. In addition it reduces the impedance level at which they are supplied to mixer 14 to a value substantially below that at which antenna stage 10 supplies them to R.-F. amplifier 12. In accordance with the invention, when relatively strong signals are received, this stage, in response to an AGC signal developed and supplied thereto in the manner described hereinafter, attenuates the input signal prior to its transmission to mixer stage 14.

More particularly, in amplifier 12, means are provided for applying static operating biases to the base and emitter thereof which remain substantially constant during the operation of the receiver. A resistor 52 applies such an emitter biasing voltage to the emitter 54 of transistor 50 by interconnecting emitter 54 and supply bus 36. Resistor 52 serves also as a load impedance element of the stage, across which the amplified R.-F. signal is developed. A voltage divider network comprising resistors 56 and 58 connected serially between supply bus 36 and a point at reference potential supply the base operating voltage. Secondary winding 42 of transformer 38 connects junction 60 of resistors 56 and 58 to base 62 of transistor 50. Resistors 52, 56 and 58 have values such as to produce a small forward-biasing potential difference between emitter 54 and base 62 which causes a low-intensity static emitter current to flow in the base-emitter path of transistor 50. The intensity of this current is selected to produce a good signal-to-noise ratio in the stage. Capacitors 64 and 66 by-pass to the point at reference potential radio-frequency currents respectively flowing in junction 60 and collector 68 of transistor 50. Collector 68 is supplied with an operating voltage the value of which depends on the amplitude of the received signal in a manner described hereinafter.

First I.-F. amplifier 16 serves two functions. It amplifies the I.-F. signal supplied to it by mixer 14 and it also amplifies a unidirectional AGC signal supplied to it by second detector 20. Its circuit is such that it operates as a common-emitter amplifier with respect to the I.-F. signals and as a common-collector amplifier with respect to the slowly varying AGC signals.

More particularly amplifier 16 comprises a transistor 72 the emitter 74 of which is connected to the supply bus 36 by two resistors 76 and 78 connected in series relationship. The junction 80 of resistors 76 and 78 is bypassed for I.-F. signals to the point at reference potential by a capacitor 82. An I.-F. transformer 84, the primary winding 86 of which is tuned to the intermediate frequency by a capacitor 88, supplies the I.-F. signal generated by mixer 14 to amplifier 16 via secondary winding 90. One terminal of winding 90 is connected to the base 92 of transistor 72, and the other terminal 94 of winding 90 is coupled to junction 80 by an I.-F. bypass capacitor 96. To derive an I.-F. output signal and to supply an operating potential to the collector 98 of transistor 72, the primary winding 100 of an I.-F. transistor 102 has one terminal connected to the point at reference potential and a tap thereon connected to collector 98. A capacitor 104 shunted across primary winding 100 tunes transformer 102 to the intermediate frequency and the secondary winding 106 of transformer 100 supplies the amplified I.-F. signal to second I.-F. amplifier 18.

A unidirectional signal developed by second detector 20 is supplied to base 92 by way of an AGC filter resistor 108, an AGC line 110 and secondary winding 90. Terminal 94 of winding 90, to which AGC line 110 is connected, is by-passed for audio frequencies to supply bus 36 by a high-valued AGC filter capacitor 112.

As discussed hereinafter in greater detail, variations in the potential of base 92 (i.e. in the value of the unidirectional AGC signal supplied thereto) are power-amplified by transistor 92 and appear at junction 80 as variations in the voltage across resistor 78. The potential at junction 80 is supplied as an amplified AGC signal to the collector 68 of R.-F. transistor 50 by way of a resistor 114 and a conductor 116. In accordance with the invention the system is constructed and arranged so that the potential supplied to collector 68 has a value negative (i.e. reverse-biasing) with respect to the potential of base 62 when the AGC potential supplied to base 92 of I.-F. transistor 72 is less than a given value corresponding to a given amplitude of received R.-F. signal; the potential supplied to collector 68 is equal to the potential of base 62 when the AGC potential supplied to base 92 is equal to said given value, and the potential supplied to collector 68 is positive (i.e. forward-biasing) with respect to the potential of base 62 when the AGC potential supplied to base 92 is greater than said given value. Junction 80 is established at the static potential level needed to achieve this result by connecting a resistor 116 between junction 80 and the point at reference potential and by selecting appropriate values for resistors 76, 78, 114 and 116, the AGC potential supplied by second detector 20 to base 92 and the static biasing potential supplied to base 62. The specific manner of selecting appropriate values for these parameters will be apparent to one skilled in the art.

Second detector 20 comprises a transistor 120 connected in the common-emitter configuration. The emitter 122 of transistor 120 is connected to voltage supply bus 36 by way of a resistor 124. A voltage divider comprising resistors 126 and 128 connected in series relationship between supply bus 36 and the point at reference potential supplies operating voltage to the base 130 of transistor 120. Base 130 is connected to the junction 132 of resistors 126 and 128 by the secondary winding 134 of an I.-F. transformer 136 which supplies the output signal of second I.-F. amplifier 18 to transistor 120. The potential supplied by the voltage divider to base 130 is only slightly more negative than the emitter potential so that the base-emitter path of the transistor is only slightly forward-biased. Accordingly positive going half-cycles of the I.-F. signal reverse-bias the base-emitter path and hence cut off the base and collector currents. Only the negative going half-cycles of the I.-F. signal produce a collector current.

To produce an audio signal and to supply an operating potential to the collector 138 of transistor 120, resistors 140 and 142 respectively are connected in series relationship between collector 138 and the point at reference potential. Capacitors 144 and 146 bypass signals of I.-F. frequency or higher. Resistor 142 is the fixed resistance element of a potentiometer the variable arm 148 of which is coupled by a capacitor 150 to the input of audio amplifier 22 and supplies thereto the audio signal developed across resistors 140 and 142. One terminal of AGC filter resistor 108 is connected to collector 138 and also is supplied with the audio signal. Resistor 108 and capacitor 112 filter this audio signal to produce the AGC potential supplied to the base 92 of first I.-F. transistor 72.

The operation of the AGC system of the invention is as follows. In the absence of any received radio signal, a small positive potential is developed by second detector 20 at collector 138 by the flow of a small collector current through resistors 140 and 142. This current corresponds to the small static emitter-base current flowing in transistor 120. This small positive potential is supplied to the base 92 of transistor 72. Under these conditions the potential of base 92 is substantially less positive than the potential of emitter 74. As a result a static emitter current of substantial intensity flows in the emitter-base path of transistor 72 and the latter accordingly is conditioned to have a high gain at the intermediate frequency. In addition this emitter current flows through resistors 78 and 76, reducing the potential at junction 80 to a value such that the potential applied to collector 68 of R.-F. transistor 50 is substantially more negative than the potential applied to base 62 thereof. Under these conditions the collector-base path of transistor 50 is sufficiently reverse-biased that transistor 50 has a high gain for radio-frequency signals supplied thereto.

When a radio signal is picked up by antenna coil 40, it is amplified by R.-F. amplifier 12, converted by mixer 14 into an I.-F. signal, successively amplified by I.-F. amplifiers 16 and 18 and supplied to second detector 20. The amplitude of the I.-F. signal supplied to detector 20 is directly dependent on the amplitude of the received radio signal. In response to this I.-F. signal, detector 20 produces at collector 138 a unidirectional potential positive with respect to reference potential and varying at an audio rate. The time-varying portion of this potential is supplied as an audio signal to audio amplifier 22, power-amplified thereby and reproduced by loudspeaker 24.

The average value of the unidirectional output potential produced at collector 138 is directly dependent on the amplitude of the I.-F. signal and hence on the amplitude of the received R.-F. signal—the greater the amplitude of the R.-F. signal, the more positive is the average value of the output potential of detector 20. This output potential is averaged by the filter comprising resistor 108 and capacitor 112 and the averaged potential is applied to base 92 of I.-F. transistor 72 as an AGC signal.

Accordingly as the received R.-F. signal increases in amplitude, the positive AGC potential applied to base 92 increases in value, and the forward-biasing potential difference between emitter 74 and base 92 decreases in value. Hence the static emitter current of transistor 72 decrease in value. This decrease in emitter current reduces the I.-F. gain of transistor 72. In addition it reduces the voltage drop across resistor 78 and hence causes the potential at junction 80 to become more positive. As a result, the potential applied to collector 68 of R.-F. transistor 50 becomes more positive. Because the potential of base 62 remains substantially constant, this increase in the collector potential decreases the value of the reverse-biasing voltage between collector 68 and base 62. As a result the R.-F. gain of transistor 50 falls. As the amplitude of the R.-F. signal increases still further, the potential applied to collector 68 becomes correspondingly more positive and the reverse-biasing voltage applied between collector 68 and base 62 becomes still smaller. As a result the gain of transistor 50 is reduced to still lower values.

In accordance with the invention, the AGC system is constructed and arranged so that, when the amplitude of the R.-F. signal increases to a given value, the potential applied to collector 68 becomes equal to the potential of base 62, and when the amplitude of the R.-F. signal increases beyond said given value, the potential applied to collector 68 becomes increasingly more positive than the potential of base 62. When this occurs, both the emitter 68 and the collector 62 of transistor 50 are forward biased. As a result the collector-base path of transistor 50 has a low impedance and therefore the transistor no longer operates in its normal mode. In particular it no longer amplifies. Instead the low-impedance series combination of capacitor 66 and the base-collector path of transistor 50 shunts secondary winding 42 of transformer 38. Because the impedance of this combination is similar to the impedance of the base-emitter path of transistor 50, the combination diverts to the point at reference potential a substantial fraction of the R.-F. signal current which ordinarily would have flowed into the base-emitter path of the transistor. Accordingly not only is the R.-F. input current supplied to transistor 50 not amplified, but only a fraction of the originally available signal current passes through the base-emitter path and develops an output signal across resistor 52. Accordingly transistor 50 acts as an attenuator of the input signal. Because it acts in this manner it affords a substantially greater range of gain control than was heretofore obtainable from a transistor amplifier. In this regard, as the potential of collector 68 is driven even more positive with respect to base 62 in response to still higher-amplitude R.-F. signals, the base-collector impedance of transistor 50 continues to decrease, and an even greater fraction of the signal current is diverted from the base-emitter path.

This considerable attenuation is achieved without the need for additional diodes. In practice it is found that the power gain of the controlled R.-F. stage of the invention can be reduced as much as 6 decibels more than was possible in prior-art systems. As a result the receiver incorporating the AGC system of the invention is able satisfactorily to receive high-amplitude R.-F. signals which would have overloaded prior-art transistor receivers and caused them to block.

In a typical case, the circuit components of the receiver shown in the drawing may have the following values:

| Circuit component: | Value |
|---|---|
| R.-F. amplifier **12**— | |
| Transistor **50** | Philco Type T–1232. |
| Resistor **52** | 3900 ohms. |
| Resistor **56** | 4.7 kilohms. |
| Resistor **58** | 5.6 kilohms. |
| Resistor **114** | 1000 ohms. |
| Capacitor **64** | 0.1 microfarad. |
| Capacitor **66** | 0.1 microfarad. |
| First I.-F. amplifier **16**— | |
| Transistor **72** | Philco Type T–1232. |
| Resistor **76** | 100 ohms. |
| Resistor **78** | 1500 ohms. |
| Resistor **116** | 1500 ohms. |
| Capacitor **82** | 0.01 microfarad. |
| Capacitor **96** | 0.01 microfarad. |
| Capacitor **112** | 25 microfarads, electrolytic. |
| Second detector **20**— | |
| Transistor **120** | Philco Type T–1033. |
| Resistor **108** | 3900 ohms. |
| Resistor **124** | 82 ohms. |
| Resistor **126** | 270 ohms. |
| Resistor **128** | 4700 ohms. |
| Resistor **140** | 330 ohms. |
| Resistor **142** | 2 kilohms. |
| Capacitor **144** | 0.05 microfarad. |
| Capacitor **146** | 0.025 microfarad. |
| Batteries **28** and **30** | Each 1.5 volts. |
| Resistor **32** | 120 ohms. |
| Capacitor **34** | 250 microfarads, electrolytic. |

These values are exemplary only and the scope of the invention is not limited thereto.

In the circuit shown in the drawings, all of the transistors are of the pnp polarity type. However these transistors alternatively may be of the npn polarity type. In such a case it is only necessary to reverse the polarity of source 26.

In the specific arrangement, the controlled amplifier is an R.-F. amplifier. However it may be an amplifier adapted to operate in any other frequency range.

In addition, the AGC potential need not be supplied to collector 68 of amplifier 12 by the specific detector—I.-F. amplifier arrangement shown in the drawings. For example detector 20 alternatively may comprise a diode or vacuum tube as its non-linear element and an additional amplifier (not shown) which amplifies only the AGC signal and not the I.-F. signal may be used to amplify the AGC signal supplied by detector 20. As another alternative a power-amplifying detector, e.g. a triode vacuum tube detector of conventional form, which is capable of supplying the requisite control power to collector 68 without additional amplification may be employed.

In addition, the AGC signal may be applied to the base of the controlled transistor instead of directly to the collector. In such an arrangement the collector is connected to a point of fixed potential by a resistor bypassed for radio frequencies, and the system is constructed to supply to the base of the controlled transistor an AGC voltage which becomes increasingly more forward-biasing in response to an increase in the amplitude of the input signal, and which forward-biases the base-collector path when the input signal amplitude exceeds a given value. In such a system, an increase in AGC potential increases the emitter current and hence the collector current. This increased collector current, flowing through the collector resistor, decreases the collector voltage and hence the transistor gain. When the AGC voltage is sufficiently large to forward-bias the base-collector path, the transistor attenuates the input signal in the manner described above. Such an arrangement is not preferred where the controlled amplifier is an R.-F. amplifier because the signal-to-noise ratio of the stage becomes poorer as the emitter current is increased. By contrast, in the preferred system shown in the drawing, the emitter-base current is held substantially constant. As a result the signal-to-noise ratio of the latter stage is considerably better than that of the former stage when large-amplitude R.-F. signals are received.

The stage shown in the drawing can be used with transistors having a relatively wide range of current gains (e.g. betas from about 8 to 200). Where the transistor has a higher current gain the range of AGC obtainable therewith is decreased somewhat because the transistor tends to conduct a relatively high collector current through resistors 114 and 78 in response to even a small emitter current, and hence the gain of the stage is reduced below its maximum value by reduction in the collector voltage even when no R.-F. signal is applied thereto.

While I described my invention by means of specific examples and in a specific embodiment, I do not wish to be limited thereto, for obvious modifications will occur to those skilled in the art without departing from the scope of my invention.

What I claim is:

1. In a gain-control system for a common-collector transistor stage comprising a transistor having emitter, collector and base electrodes, means for applying an input signal between said base electrode and said collector electrode, means for applying an operating potential to one of said base and collector electrodes and means coupled to said emitter electrode for producing in response to said input signal an output signal having an amplitude directly related to the amplitude of said input signal, the improvement comprising means responsive to said output signal to produce a control potential dependent on the amplitude of said output signal in the following manner:

(1) when said output signal has a value less than a given amplitude, said control potential is such as to reverse-bias the base-collector path of said transistor when applied to the other of said base and collector electrodes, and (2) when said output signal has an amplitude above said given amplitude, said control potential is such as to forward-bias said base-collector path when applied to said other electrode, means for supplying said output signal to said output-signal-responsive means and means for applying said control potential to said other electrode.

2. A system according to claim 1, wherein said output-signal-producing means comprise a load impedance connected to said emitter electrode for supplying an operating potential thereto.

3. A system according to claim 1, wherein said one electrode is said base electrode and said other electrode is said collector electrode.

4. In a gain control system for a common-collector transistor stage comprising a transistor having an emitter, a collector and a base, means for applying an alternating input signal between said base and said collector, means for applying a substantially constant operating potential to said base, load means connected to said emitter for applying thereto a substantially constant forward-biasing potential and for producing in response to said input signal an alternating output signal having an amplitude directly related to the amplitude of said input signal, the improvement comprising means responsive to said output signal to produce a control potential dependent on the amplitude of said output signal in the following manner:

(1) when said output signal has an amplitude less than a given amplitude, said control potential is such as to reverse-bias the base-collector path of said transistor when applied to said collector and approaches said operating potential applied to said base as the amplitude of said output signal approaches said given amplitude, (2) when said output signal has an amplitude equal to said given amplitude, said control potential is equal to said operating potential applied to said base, and (3) when said output signal has an amplitude greater than said given amplitude, said control potential is such as to forward-bias said base-collector path when applied to said collector and becomes increasingly different from said operating potential applied to said base as said output signal increases in amplitude, means for supplying said output signal to said output-signal-responsive means and means for applying said control potential to said collector.

5. A system according to claim 4, wherein said output-signal-responsive means comprise detector means supplied with and responsive to said output signal to produce a unidirectional voltage directly dependent on said amplitude of said output signal and equal to a given voltage when said amplitude of said input signal is equal to said given amplitude, and amplifier means supplied with and responsive to said unidirectional voltage to produce as said control potential a potential which approaches said operating potential applied to said base as said unidirectional voltage increases toward said given voltage, becomes equal to said potential applied to said base when said unidirectional voltage is equal to said given voltage and becomes increasingly different from said potential applied to said base as said unidirectional voltage becomes increasingly higher than said given voltage, and direct-current-conductive means connecting said amplifier to said collector for applying said control potential thereto.

References Cited in the file of this patent

UNITED STATES PATENTS 2,983,815 Guyton et al. ----------- May 9, 1961

OTHER REFERENCES

Milton, S. K.: Transistors in Radio and Television, N.Y., McGraw-Hill, 1956, page 160.